United States Patent [19]
Kata

[11] Patent Number: 6,114,754
[45] Date of Patent: Sep. 5, 2000

[54] TAPE AUTOMATED BONDING FILM

[75] Inventor: Keiichiro Kata, Tokyo, Japan

[73] Assignee: NEC Corporation, Tokyo, Japan

[21] Appl. No.: 09/199,363

[22] Filed: Nov. 25, 1998

[30] Foreign Application Priority Data

Nov. 27, 1997 [JP] Japan ..................................... 9-325519

[51] Int. Cl.[7] .............................................. H01L 23/498
[52] U.S. Cl. ........................... 257/668; 257/673; 257/778
[58] Field of Search ..................................... 257/786, 778,
257/672, 668, 673

[56] References Cited

U.S. PATENT DOCUMENTS 5,168,368  12/1992  Gow, 3rd et al. ....................... 257/668
5,293,066   3/1994  Tsumura .................................. 257/668
5,473,190  12/1995  Inoue et al. ............................. 257/668

*Primary Examiner*—David Hardy
*Attorney, Agent, or Firm*—Hutchins, Wheeler & Dittmar

[57] ABSTRACT

An area TAB film has a plurality of first lead lines and a plurality of second lead lines on a base film. Each of first lead lines will be electrically connected to each of peripheral electrode pads while each of second lead lines will be electrically connected to each of inner electrode pads when the chip will be mounted on the TAB film. In this TAB film, the first and the second lead lines have a staggered arrangement from each other and are extended in opposite directions. Practically, the distance or the gap between the first lead lines is wider than that of conventional TAB film. Consequently, the TAB film can cope with an increase of the number of pads with a package size kept unchanged and serves to obtain a low cost package as compared with the conventional TAB film.

3 Claims, 13 Drawing Sheets

TAPE AUTOMATED BONDING FILM

BACKGROUND OF THE INVENTION

This invention relates to a tape automated bonding film (will be abbreviated to a TAB film hereinafter) for use in mounting a chip.

Various kinds of packaging technology to package a chip have been proposed. Among others, TCP (tape-carrier package) technology which packages a chip mounted on a TAB film is superior to the other technology in view of making thin packages. Owing to this property of the TCP, packages which are manufactured by the use of TCP technology are very often utilized in a wide variety of devices, for instance, note type PCs (personal computers).

More specifically, a peripheral TAB film is often used as a TAB film in the TCP technology and, therefore, the TCP technology using the peripheral TAB film may be also called a peripheral TAB technology. In the peripheral TCP technology, the peripheral TAB film has a base film divided into a chip mounting area for a chip and an outside area for surrounding the chip mounting area. In particular, the chip mounting area is further sub-divided into a central region and a peripheral region located outside of the central region.

It is to be noted that the peripheral TAB film has a plurality of connection points formed on the peripheral region and a plurality of inner leads (or inner lead lines) which are formed on the base film and are connected to the connection points. Herein, the inner leads are radially laid toward the outside region from the connection points while the remaining edges of the inner leads are connected to bumps for terminals of printed circuit or outer leads.

Under the circumstances, a chip is mounted on the peripheral TAB film with electrode pads (merely may be called pads hereinafter) of the chip connected to the connection points. As readily understood from the above, the electrode pads of the chip for the peripheral TAB film are arranged only on a peripheral part of the chip surface.

However, the peripheral TAB technology has shortcomings as will be described when a density of integrated circuits in chips becomes high with progress of the semiconductor technology.

Generally, it is required that high density chips have a great number of electrode pads. Taking this into consideration, intervals or pitches between the electrode pads must become narrow in order to prevent the package from being large in size when such high density chips are manufactured by the peripheral TAB technology. However, narrowing pitches between electrode pads is restricted by a package process and a board assembling process. Alternatively, it is assumed that various sizes of packages all have same pitches between pads. In this event, the packages inevitably become large in size with an increase of electrode pads.

On the other hand, it is a recent trend that requirements have been directed to packages which are small in size and thin in thickness because an electronic apparatus formed by a plurality of such packages becomes small and thin. As described before, the peripheral TAB technology cannot meet these requirements.

To respond to the requirements, an area TAB technology has been proposed. The area TAB technology differs from the peripheral TAB technology and, in the area TAB technology, pads are arranged not only on a peripheral region of the chips surface but also on other region, such as a region located inside of the peripheral region. For the purpose of this, the area TAB technology uses, instead of the above mentioned peripheral TAB film, an area TAB film which further has other connection points corresponding to the pads located on such other region. Needless to say, the other connection points are also connected to other lead lines.

According to the technology, many pins can be derived from many electrode pads without an increase of a package size and with pitches between pads kept unchanged.

At any rate, when intervals between inner leads become narrow, all the conventional technologies reach the limits of manufacturing a TAB film itself. This is due to necessity of a process margin on designing packages which have an increased number of pads. Such limits also result from a reduction of degrees of freedom regarding leads each of these conventional technologies. Attempts to forcibly exceed the limit give rise to breakage or short circuits in lead patterns and bring about decrease of yield.

For avoiding the problems of these techniques, further proposal has been made about TAB films which use a multi-layered metal wiring technique. Such a TAB film may have, for example, two metal wiring layers.

However, such a type of a TAB film comprising two metal wiring layers further requires a process of adding a metal layer to the film and another process of forming via holes into the film owing to its structure. Moreover, via holes must be minimized in order to make a package small in size. Thus, the use of such multi-layered metal wiring technique indispensably makes a manufacturing cost high and, therefore, is undesirable in the consumer market.

SUMMARY OF THE INVENTION

It is therefore an object of the present invention to provide a TAB film capable of coping with an increase of the number of pads with package size kept to obtain a low cost package.

It is another object of the present invention to provide a package which is small in size and thin in thickness and which is manufactured by the use of the above TAB film.

Other objects of this invention will become clear as the description proceeds.

According to the present invention, a package comprises a TAB film which is for use in mounting a chip and which has a base film, a plurality of peripheral connection points, a plurality of inner connection points, a plurality of first bumps, a plurality of first lead lines, a plurality of second bumps, and a plurality of second lead lines.

The peripheral connection points and the inner connection points all correspond to electrode pads of the chip which will be mounted on the TAB film. Besides, roughly speaking, the peripheral connection points and the inner connection points are alternately arranged on the base film. Furthermore, each of the peripheral connection points is connected to each first lead line which is radially laid toward outside of an area for the chip from each peripheral connection point. On the other hand, each of the inner connection points is connected to each second lead line which is laid toward inside of the area from each inner connection point.

In detail, the TAB film according to this invention is described hereinafter.

The base film has a chip mounting area for the chip and an outside area for surrounding the chip mounting area. The chip mounting area is, furthermore, divided into a central region, a peripheral region located outside of the central region, and an intermediate region between the central region and the peripheral region.

The plurality of peripheral connection points are ford on the peripheral region while the plurality of inner connection points are formed on the intermediate region. Furthermore, the peripheral connection points and the inner connection points are alternately arranged on the chip mounting area.

Each of the plurality of first bumps corresponds to each of the peripheral connection points and the first bumps are all formed on the outside area. Moreover, the plurality of first lead lines are formed on the base film and each of them is connected between each peripheral connection point and each first bump.

On the other hand, each of the plurality of second bumps corresponds to each of the inner electrode pads and the second bumps are all formed on the central region. And, moreover, the plurality of second lead lines are formed on the base film and each of them is connected between each inner electrode pad and each second bump.

With this structure, the first lead line and the second lead line are not arranged side by side. That is, an interval between first lead lines has double width in comparison with another interval between lead lines in the above-mentioned conventional techniques. Besides, the first and second lead lines are formed on the same plane or layer and, namely, the AB film of this invention has only one wiring layer. Thus, the TAB film of the present invention can cope with an increase of the number of pads with package size kept to obtain a low cost package as compared with the above-mentioned techniques. And, the result of that, a package manufactured by using the TAB film is small in size and thin in thickness.

DESCRIPTION OF THE PREFERRED EMBODIMENTS

Figure 1:
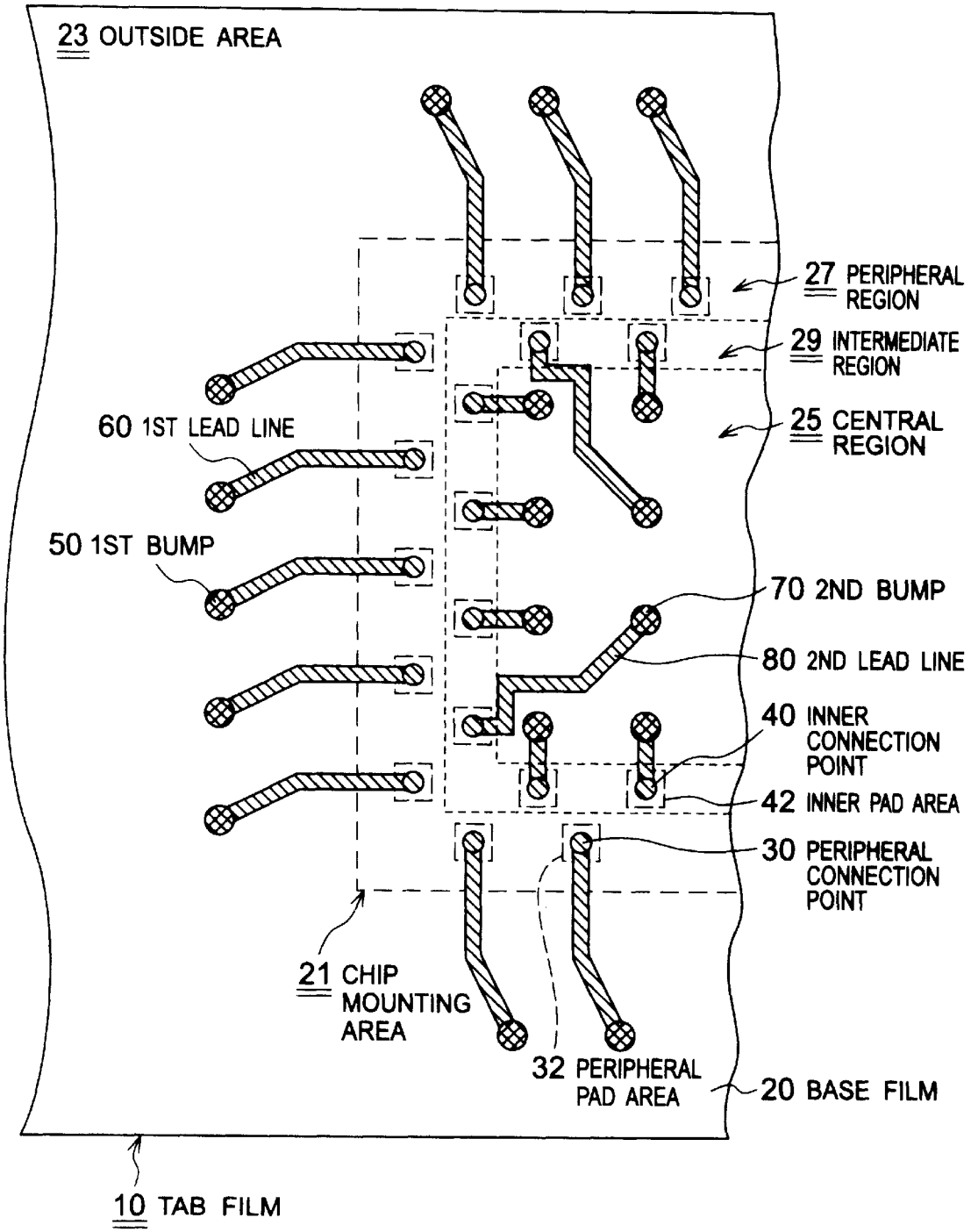
FIG. 1 shows a rear view for use in describing a basic structure of a TAB film according to the present invention.

Referring to FIG. 1, a basic structure of a TAB film 10 according to this invention is roughly shown. The TAB film 10 which has a front surface and a back surface is for mounting a semiconductor chip on the front surface.

Herein, it is to be noted that the semiconductor chip has electrode pads arranged not only on the a peripheral region of the chip surface but also on the other or remaining region located inside of the peripheral region of the chip. Thus, the chip is assumed to be matched with the area TAB technology as described above and therefore has peripheral pads formed on the peripheral region of the chip and inner pads formed on the other region.

On the back or the rear surface of the TAB film 10, lead lines (60, 80) and bumps (50, 70) are formed in a manner to be described in detail later. As is readily understood from FIG. 1, the TAB film 10 according to the present invention is specified by an area TAB film.

More specifically, the illustrated TAB film 10 according to the present invention has a base film 20 which is made of an insulator film and which has a chip mounting area 21 for the chip and an outside area 23 surrounding the chip mounting area 21. The chip mounting area 21 corresponds to an area on which the chip will be mounted and is precisely positioned on a reverse or an opposite side of the area where the chip will be mounted, in FIG. 1. The chip mounting area 21 is furthermore divided into a central region 25, a peripheral region 27 located outside of the central region 25, and an intermediate region 29 between the central region 25 and the peripheral region 27.

The TAB film 10 also has peripheral connection points 30, inner connection points 40, first bumps 50, first lead lines 60, second bumps 70, and second lead lines 80. They are all formed on the reverse or rear surface of the base film 20.

In detail, the peripheral connection points 30 are formed on the peripheral region 27 while the inner connection points 40 are formed on the intermediate region 29. To be precise, the peripheral connection points 30 are located at peripheral pad areas 32 for the peripheral pads of the chip which will be mounted on the TAB film 10. On the other hand, the inner connection points 40 are located at inner pad areas 42 for the inner pads of the chip, as shown in FIG. 1. Furthermore, the peripheral connection points 30 and the inner connection points 40 are alternately arranged on the chip mounting area, like a chessboard. In other words, each peripheral connection point 30 is positioned between two adjacent ones of the inner connection points 40, as illustrated in FIG. 1.

In the example of FIG. 1, the points 30 and 40 are electrically connected, through via-holes, to other points on the front surface of the TAB film 10, corresponding to points 30 and 40, respectively. For convenience of description, combinations of the points 30 and 40 on the rear surface of the TAB film, the other points placed on the front surface and connected to the points 30 and 40, and the via-holes will be collectively referred to as the peripheral connection points 30 and the inner connection points 40, respectively.

Moreover, each of the first bumps 50 corresponds to each of the peripheral connection points 30 and is positioned at all of the outside area 23. Each of the first lead lines 60 is formed on the base film 20 and outwardly extended toward each first bump 50 from each peripheral connection point 30. In other words, each first lead line 60 is connected between each peripheral connection point 30 and each first bump 50.

On the other hand, each of the second bumps 70 corresponds to each of the inner connection points 40 and is placed on the central region 25. Each of the second lead lines 80 is laid on the base film 20 and inwardly extended from each inner connection point 40 to each second bump 70. Stated otherwise, each second lead line 80 is connected between each inner connection point 40 and each second bump 70.

In the above structure, the first and the second lead lines 60 and 80 have a staggered arrangement from each other and are extended in opposite directions.

Practically, the distance or the gap between first lead lines 60 is substantially equal to twice the distance of the above-mentioned conventional techniques. Besides, the first and second lead lines 60 and 80 are wired or formed on the same plane or layer without any expansion of an area of the layer. In other words, the illustrated TAB film 10 has only one wiring layer.

Consequently, the TAB film 10 of the present invention can cope with an increase of the number of pads with a package size kept unchanged and serves to obtain a low cost package as compared with the above-mentioned conventional techniques. As a result, the package manufactured by using the TAB film 10 is small in size and thin in thickness.

Now, detail explanation will be made about TAB films of first through fourth embodiments together with processes manufacturing them.

Figure 2:
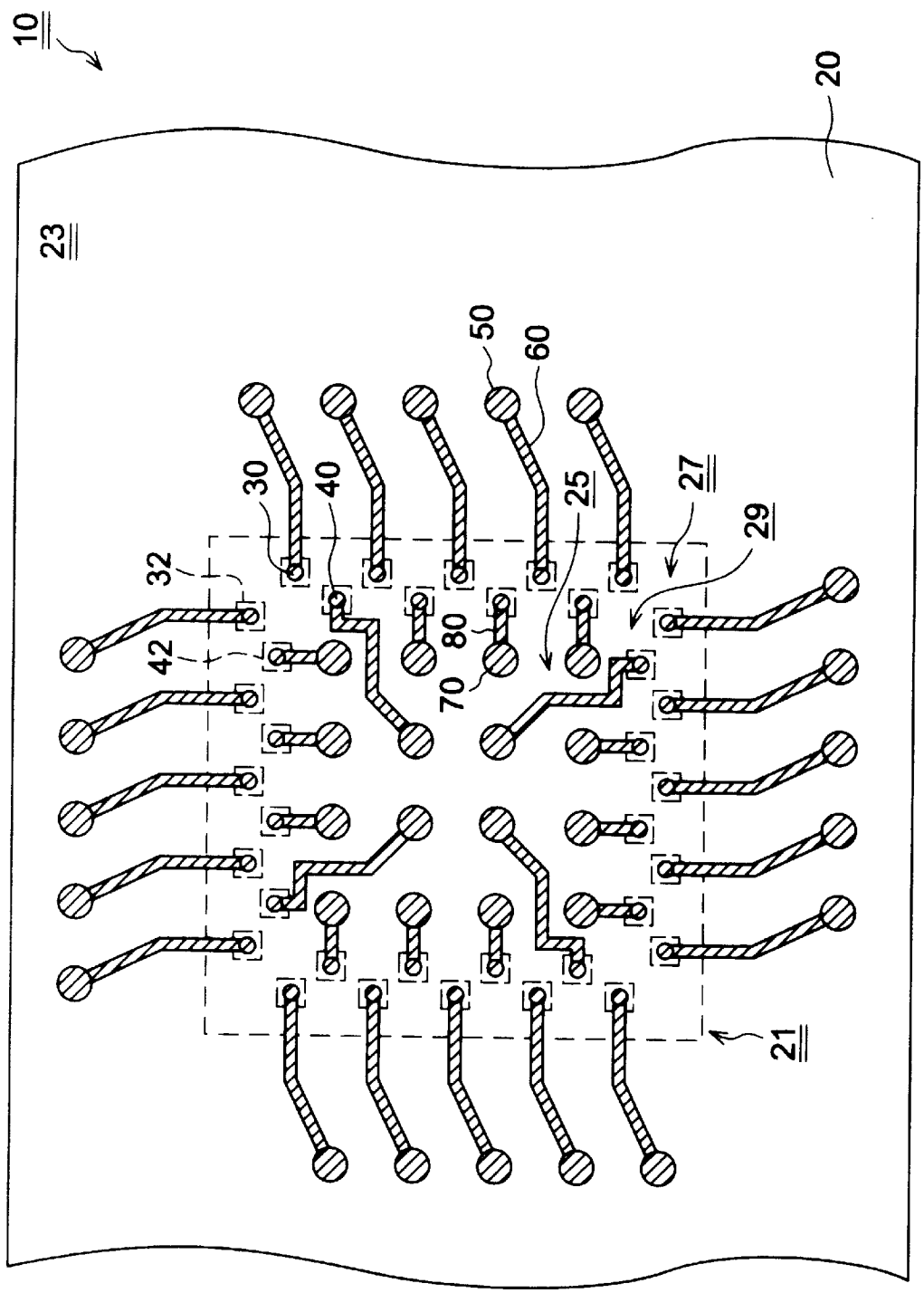
FIG. 2 shows a rear view of a TAB film according to a first embodiment of this invention.
Figure 3:
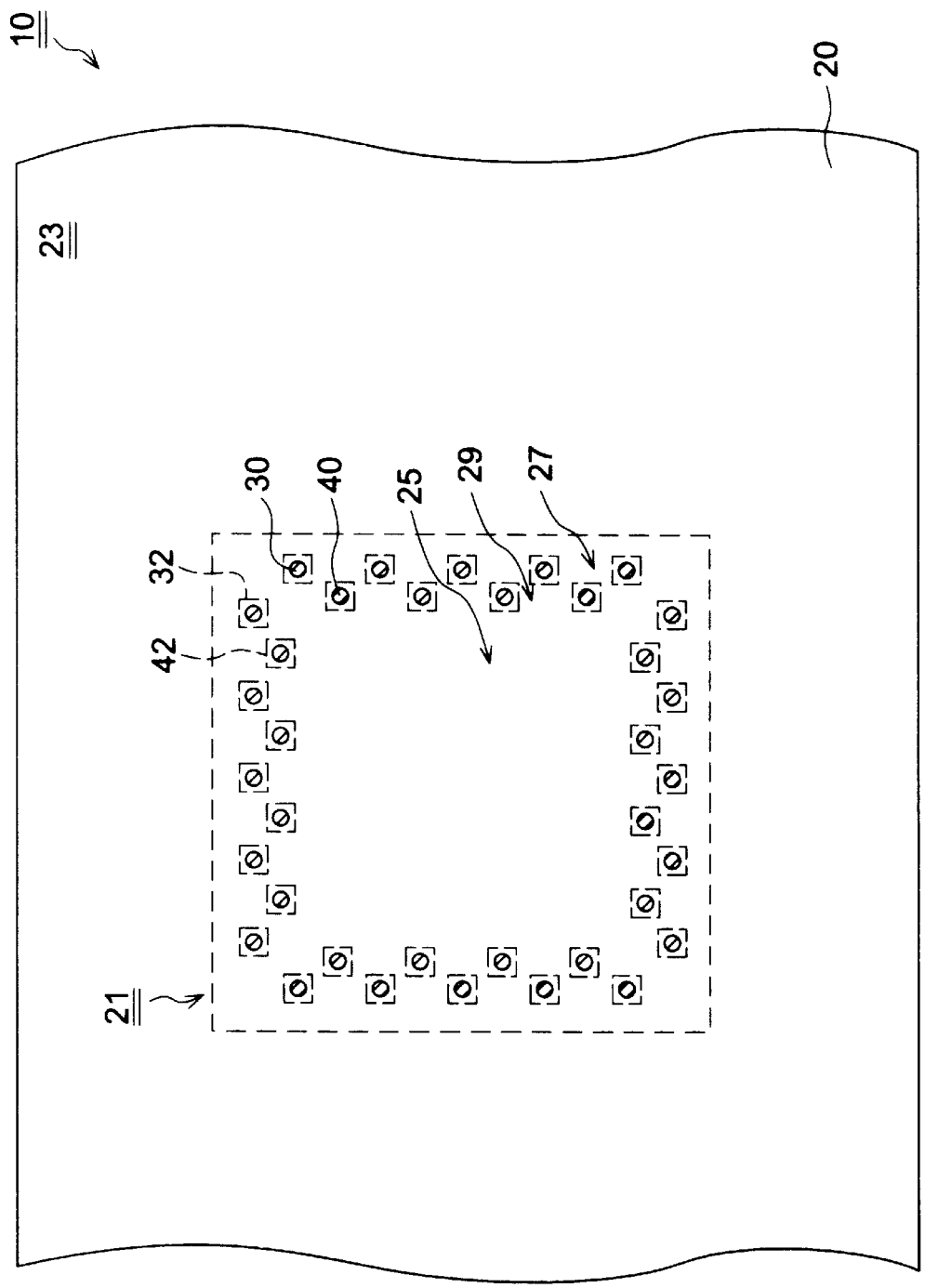
FIG. 3 shows a front view of the TAB film depicted in FIG. 2.

Referring to FIGS. 2 and 3, a TAB film 10 according to the first embodiment of the present invention has a rear surface and a front surface as shown in FIGS. 2 and 3, respectively. In addition, the illustrated TAB film 10 has a base film 20, peripheral connection points 30, inner connection points 40, first bumps 50, first lead lines 60, second bumps 70, and second lead lines 80, like in FIG. 1. In particular, it is to be noted that the peripheral connection points 30 illustrated in FIGS. 2 and 3 are equal in number to twenty-five and each of the first bumps 50 and the first lead lines 60 is also equal in number to twenty-five. On the other hand, the inner connection points 40 are equal in number to sixteen and each of the second bumps 70 and the second lead lines 80 is also equal in number to sixteen.

In the first embodiment shown FIGS. 2 and 3, the first lead lines 60 are extended from an inside area outwards at every side of the chip mounting area 21 and are connected between the peripheral connection points 30 and the first bumps 50, respectively. In particular, the first lead lines 60 have the same shape as shown FIG. 2.

On the other hand, it is to be noted in FIG. 2 that the second lead lines 80 which are arranged at every fourth lines 80 have a configuration different from that of the other ones of the second lead lines. Furthermore, the second bumps 70 are arranged in a matrix or an array fashion of four by four. Thus, a short circuit in lead pattern does not occur in the central area.

Figure 4:
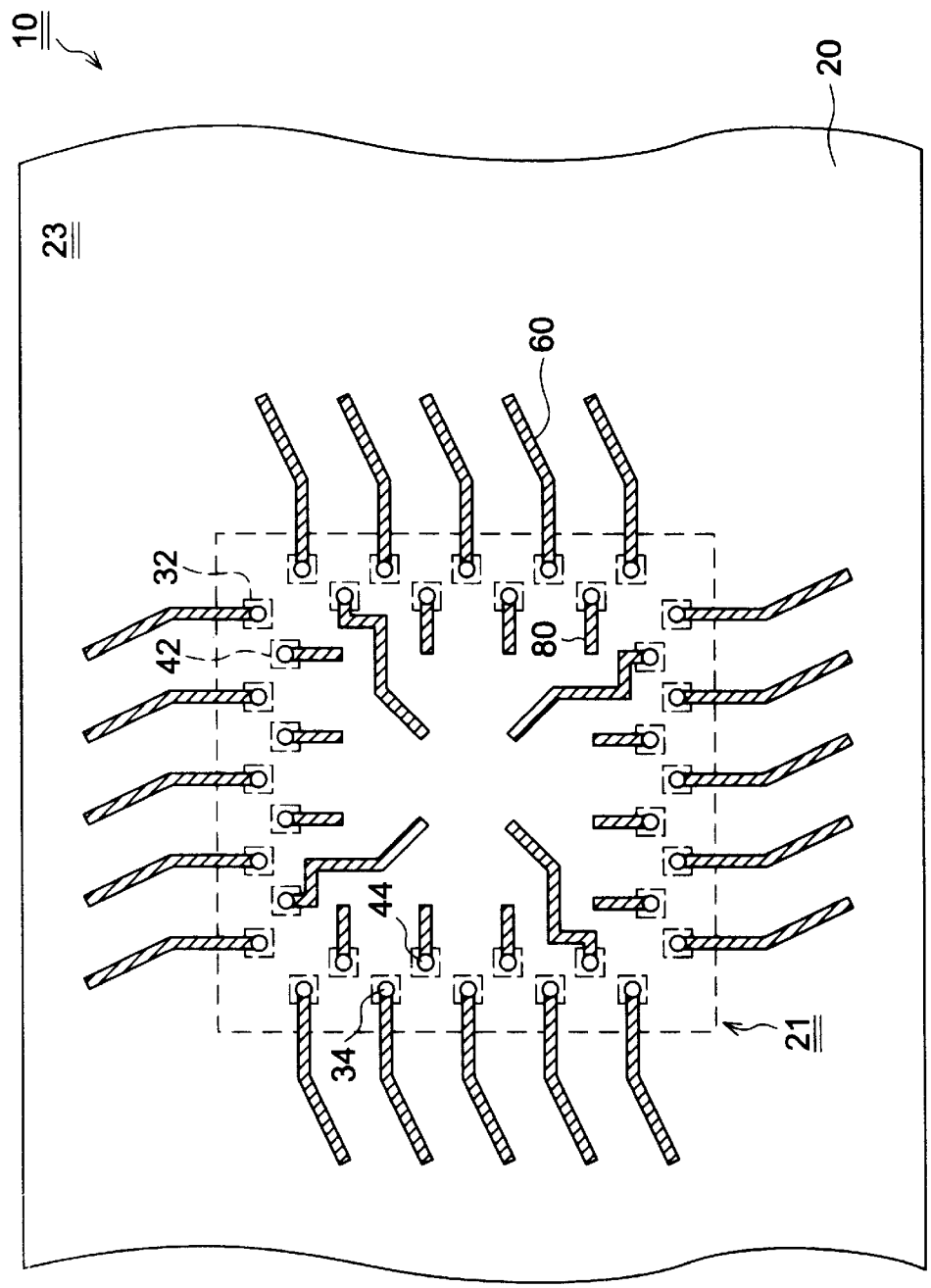
FIG. 4 shows a rear view for use in describing a manufacturing process of the TAB film depicted in FIG. 2.
Figure 5:
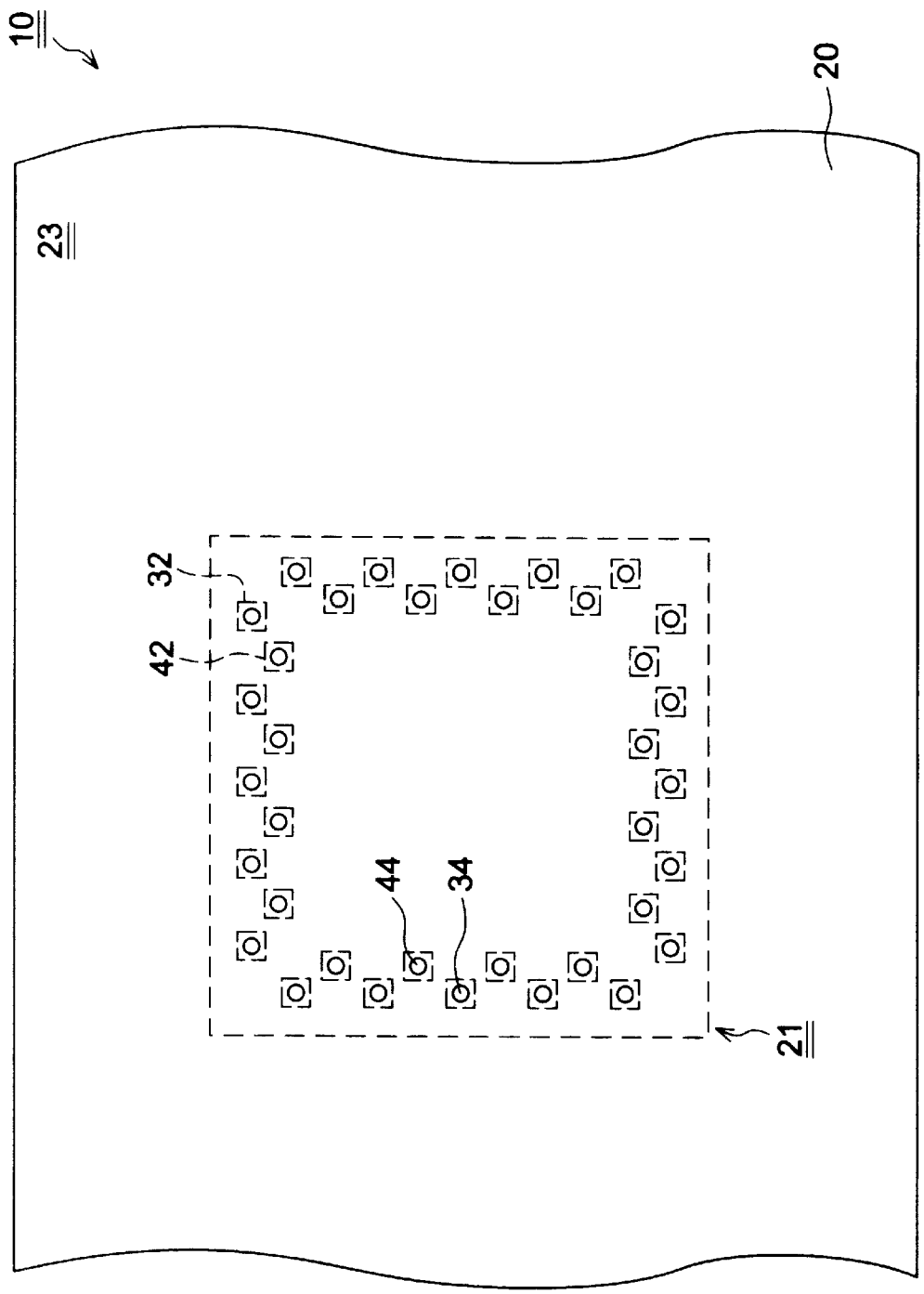
FIG. 5 shows a front view of the TAB film illustrated in FIG. 2.

The TAB film 10 with the above structure is manufactured by the process described hereinafter with reference to FIGS. 4 and 5 also.

First, lead patterns of the first and second lead lines 60 and 80 are formed on an insulator film as the base film 20 by using a photo-resist method. Then, openings 34 and 44 which will serve to form via holes with metal material are formed on positions in a peripheral pad area 32 and inner pad areas 42, as shown in FIGS. 4 and 5. Each of positions corresponds to one of the peripheral connection point 30 and the inner connection point 40.

After formation of the openings 34 and 44, each opening 34 and 44 is filled with metal material by using electroless plating and, thereby, each of via holes is formed. Lastly, the first and second bumps 50 and 70 are formed on the predetermined positions mentioned above and, as a result, the TAB film 10 according to the first embodiment is manufactured.

Figure 6:
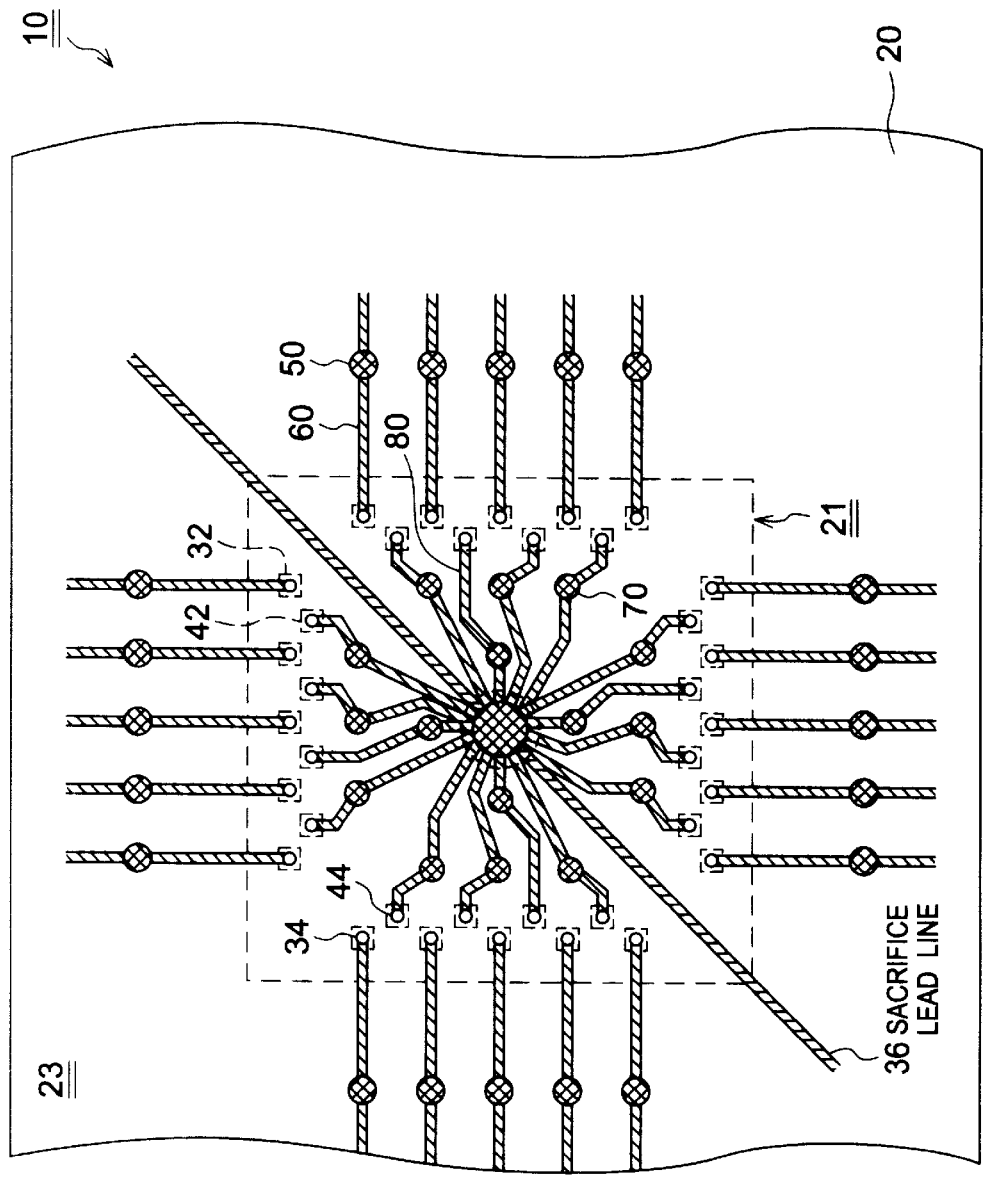
FIG. 6 shows a back view for use in describing a manufacturing process of a TAB film according to a second embodiment of this invention.

Referring to FIG. 6, a TAB film 10 according to a second embodiment of the present invention is manufactured through a process specified by FIG. 6. In this embodiment, an electrochemical coating technique is used instead of electroless plating to fill openings with metal material.

More specifically, first, lead patterns of the first and second lead lines 60 and 80 and an redundant or sacrifice lead line 36 are formed on a rear surface of an insulator film as the base film 20, as shown in FIG. 6. These lead patterns are joined or electrically connected together at a center portion of the chip mounting area 21. On the first and second lead lines 60 and 80, the first and second bumps are formed, respectively. Furthermore, openings 34 and 44 are formed at predetermined positions in peripheral pad area 32 and inner pad areas 42, as shown in FIG. 6.

Figure 7:
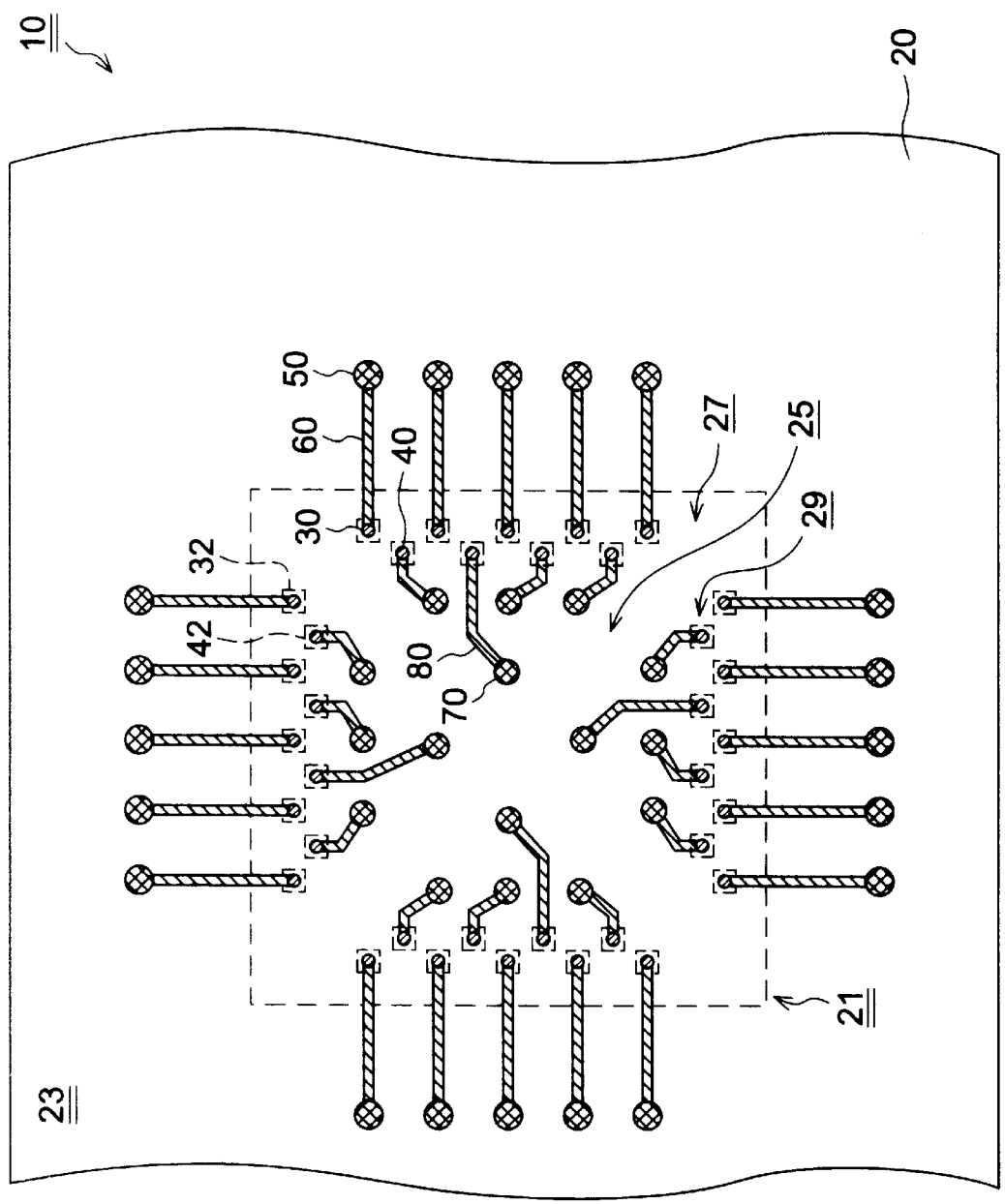
FIG. 7 shows a rear view of the TAB film of the second embodiment.

Thereafter, the electrochemical coating is carried out at the sacrifice of the sacrifice lead line 36 to fill the openings 34 and 44 with metal material. Lastly, an extra or redundant lead pattern, such as the sacrifice lead line 36, is removed by executing selective chemical etching. Consequently, all of the second bumps 70 are electrically disconnected from one another. Such process is effective to manufacture the TAB film 10 according to the second embodiment of the present invention, as shown in FIG. 7.

Figure 8:
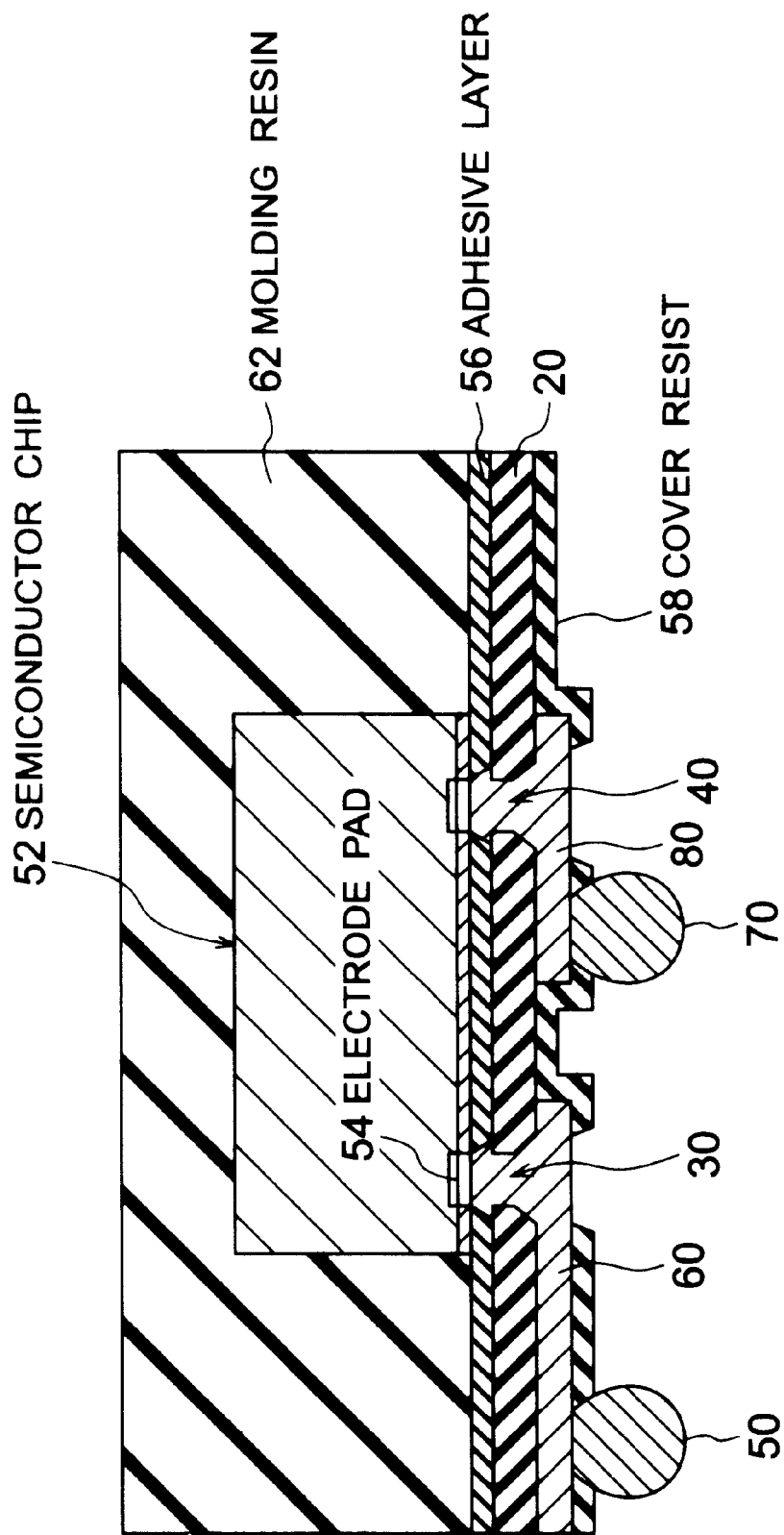
FIG. 8 shows a sectional view of a TCP manufactured by using the TAB film of the second embodiment.

Referring to FIG. 8, a sectional view of a TCP is depicted. The TCP is manufactured by using the TAB film as shown in FIG. 7 and supports a semiconductor chip 52.

In detail, the semiconductor chip 52 has electrode pads 54 corresponding to the peripheral connection points 30 or the inner connection points 40 and is mounted on the front surface of the TAB film. In the illustrated example, the semiconductor chip 52 is glued on the front surface of the base film 20 (the TAB film) through an adhesive layer 56. Thus, the semiconductor chip 52 are fixed to the TAB film with each of the electrode pads 54 electrically connected to one of the first and second bumps 50 or 70. In this condition, the semiconductor chip 52 is coated with or packaged by molding resin 62 and, furthermore, the rear surface of the base film 20 (the TAB film ) are covered with a cover resist 58. In this way, the TCP of the second embodiment is obtained.

Figure 9:
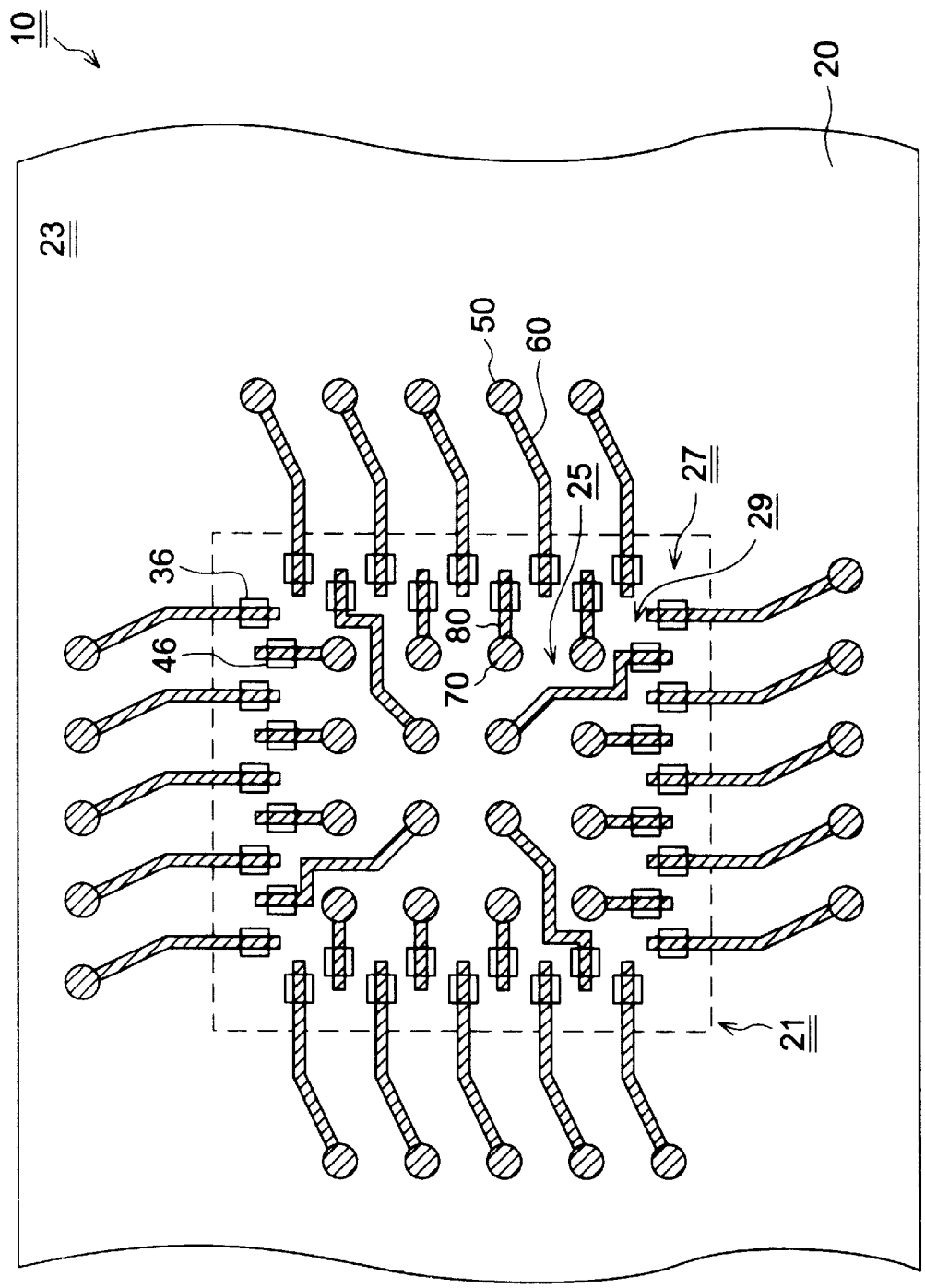
FIG. 9 shows a rear view of a TAB film according to a third embodiment of this invention.
Figure 10:
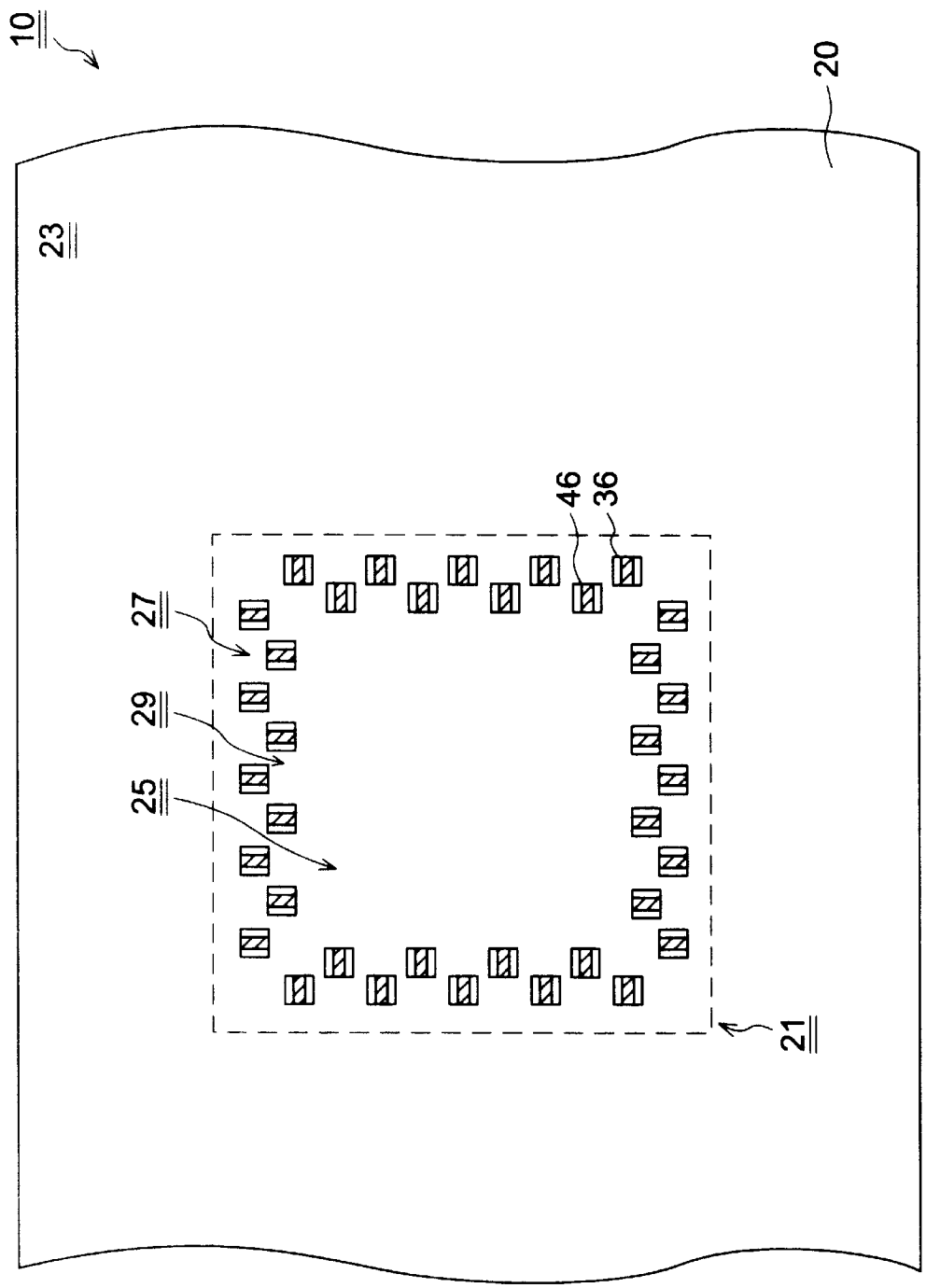
FIG. 10 shows a front view of the TAB film illustrated in FIG. 9.

Referring to FIGS. 9 and 10, a TAB film 10 according to a third embodiment of the present invention has a rear surface and a front surface illustrated in FIGS. 9 and 10, respectively, and is roughly similar in structure to the TAB film according to the first embodiment except the peripheral connection points 30 and the inner connection points 40 are not depicted in both of FIGS. 9 and 10.

As compared with the first embodiment, the TAB film 10 according to the third embodiment has a feature mentioned below. In this embodiment, the first and second lead lines 60 and 80 are formed on the base film 20 and cross over peripheral pad areas 36 and inner pad areas 46, respectively. Furthermore, both of the peripheral pad areas 36 and the inner pad areas 46 are opened, as shown in FIGS. 9 and 10.

These distinctive characteristics are caused to occur due to a method of manufacturing the TAB film 10 of this embodiment, as described hereinafter.

First, the method includes a process of opening the peripheral and inner pad areas 36 and 46 on an insulator film to obtain the base film 20. Then, a plurality leaves are glued over the base film 20 as a wiring layer and, furthermore, unnecessary parts of each leaf are etched by a photo-resist technique to form the first and the second lead lines 60 and 80 having shapes mentioned above. Subsequently, the openings of the peripheral and inner pad areas 36 and 46 are filled with metal material by using electroless plating and, thereby, via holes are formed. Lastly, the first and second bumps 50 and 70 are formed on the edges of the first and second lead lines 60 and 80, respectively. Thus, the TAB film 10 of the third embodiment is obtained.

Figure 11:
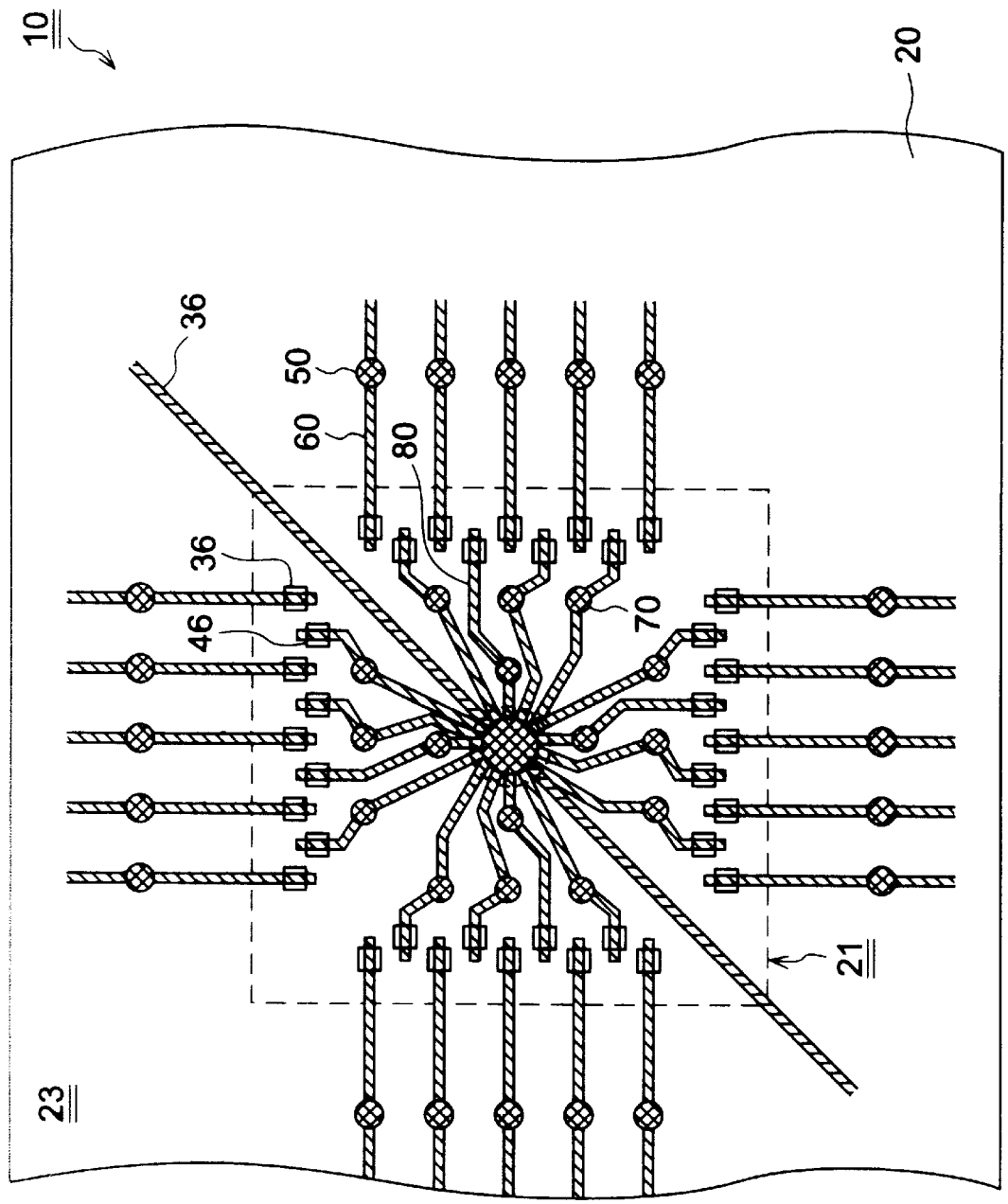
FIG. 11 shows a rear view for use in describing a manufacturing process of a TAB film according to a fourth embodiment of this invention.

Referring to FIG. 11, a process is illustrated which is included in a method of manufacturing a TAB film 10 according to the fourth embodiment of the present invention. As readily understood from FIG. 11, the TAB film 10 according to this embodiment is manufactured in a manner mentioned in connection with the second and third embodiments. That is, in this embodiment, the electrochemical coating technique is used to fill openings of the base film with metal material.

In detail, first, openings of the peripheral and inner pad areas 36 and 46 are forced on an insulator film to obtain the base film 20. Then, a plurality of leaves are glued over the base film 20 as a wiring layer and, furthermore, unnecessary parts of each leaf are etched by a photo-resist technique to form the first and second lead lines 60 and 80 and a sacrifice lead line 36, as shown in FIG. 11. Subsequently, the first and second bumps 50 and 70 are formed on the first and second lead lines 60 and 80, respectively, as shown in FIG. 11.

Thereafter, electrochemical coating is carried out at the sacrifice of the sacrifice lead line 36 to fill the openings of the peripheral and inner pad areas 34 and 44 with metal material. Lastly, an extra lead pattern, such as the sacrifice lead lines 36, is removed by punching a hole around center of the chip mounting area 21. Consequently, all of the second bumps 70 are electrically disconnected from one another. Such process is effective to manufacture the TAB film 10 according to the fourth embodiment of the present invention.

Figure 12:
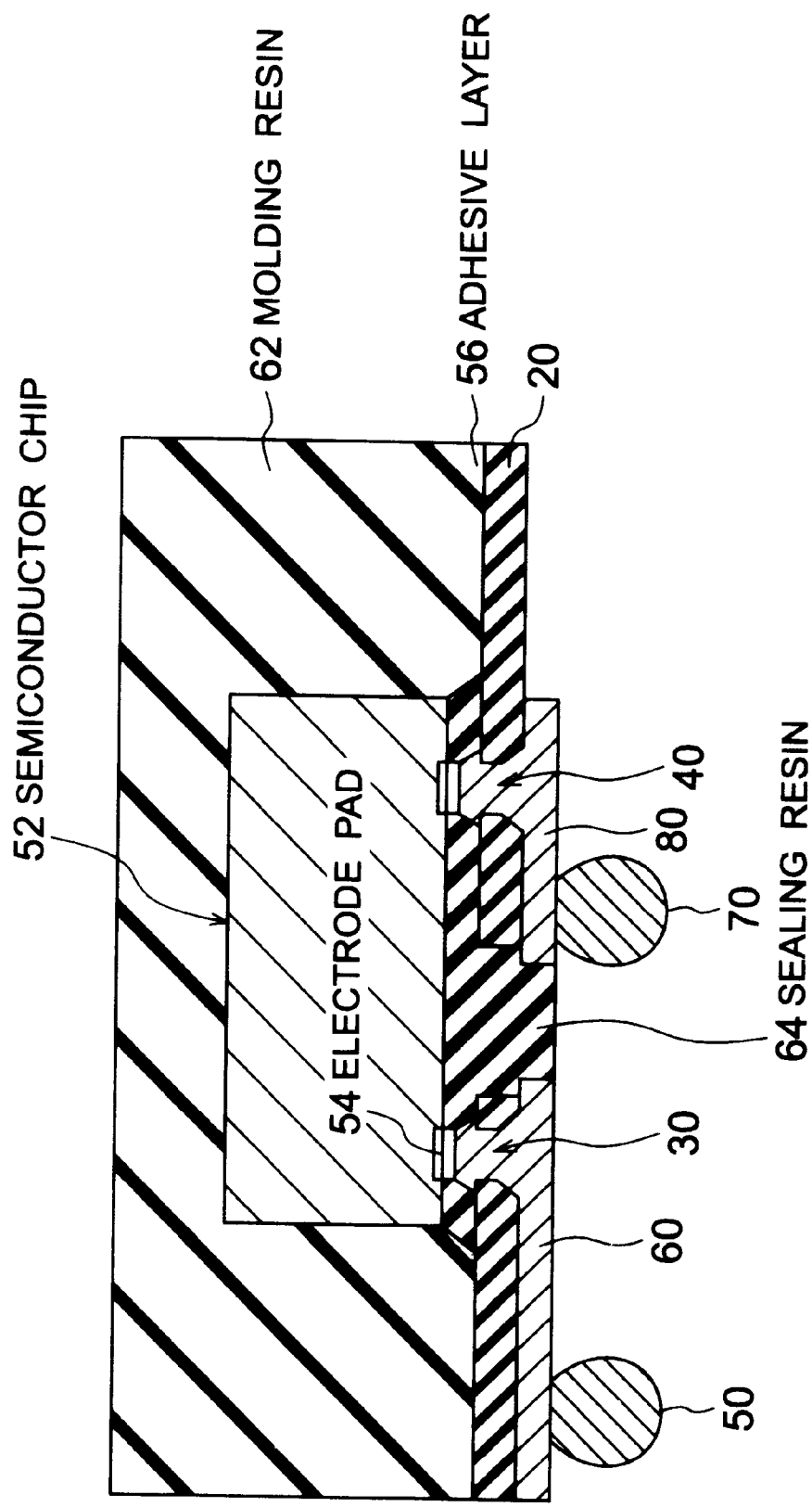
FIG. 12 shows a sectional view of a TCP manufactured by using the TAB film illustrated in FIG. 11.

Referring to FIG. 12, a sectional view of a TCP is depicted. The TCP is manufactured by using the TAB film of the fourth embodiment and supports a semiconductor chip 52.

In detail, the semiconductor chip 52 has electrode pads 54 corresponding to the peripheral connection points 30 or the inner connection points 40 and is mounted on the front surface of the TAB film. In the illustrated example, the semiconductor chip 52 is coated with or packaged by molding resin 62 and, furthermore, the rear surface of the base film 20 (the TAB film), in particular, around the punched hole is sealed with sealing resin 64. Thus, the semiconductor chip 52 are fixed to the TAB film with each of the electrode pads 54 electrically connected to one of the first and second bumps 50 or 70. In this way, the TCP of the fourth embodiment is obtained.

The above explanations have been mentioned only about area TAB films. However, the concept of this invention can be also applied to the peripheral TAB technology. Hereinafter, an explanation will be made about a TAB film of that case.

Figure 13:
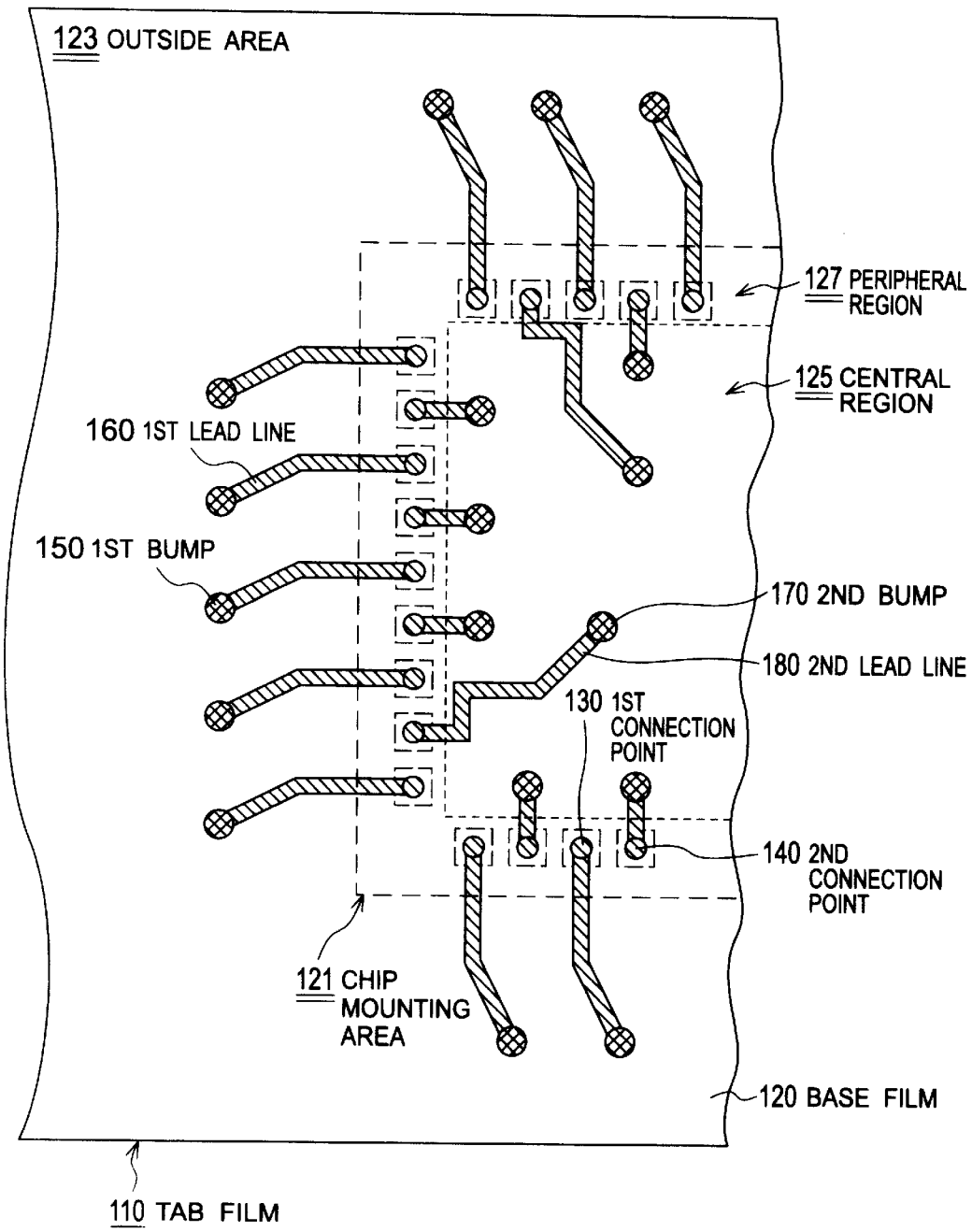
FIG. 13 shows a rear view for use in describing another basic structure of a TAB film according to the present invention.

Referring to FIG. 13, a basic structure of another TAB film 110 according to this invention is roughly shown. The TAB film 110 is for mounting, on the front thereof, a semiconductor chip which has electrode pads arranged on the a peripheral region of the chip surface. Thus, the chip is for the peripheral TAB technology as described above and, namely, has pads formed on the peripheral region of the chip. On the back of the TAB film 110, lead lines (160, 180) and bumps (150, 170) are formed, as described in detail later.

In detail, a TAB film 110 of this invention has a base film 120 made of an insulator film. The base film 120 is divided into a chip mounting area 121 for the chip and an outside area 123 surrounding the chip mounting area 121. The chip mounting area 121 corresponds to an area on which the chip will be mounted and, to be precise, is a reverse side of the area where the chip will be mounted, in FIG. 13. The chip mounting area 121 is further sub-divided into a central region 125 and a peripheral region 127 located outside of the central region 125.

The TAB film 110 also has first connection points 130, second connection points 140, first bumps 150, first lead lines 160, second bumps 170, and second lead lines 180. These are all formed on the reverse side of the base film 120.

In detail, all of the first and second connection points 130 and 140 are alternately arranged on the peripheral region 127. In the example of FIG. 13, the first and second connection points 130 and 140 are electrically connected, through via-holes, to other points on the front of the TAB film 110, corresponding to points 130 and 140, respectively. For convenience of description, combinations of the points 130 and 140 on the rear surface of the TAB film 110, the other points placed on the front surface, and via-holes will be collectively referred to as the first and second connection points 130 and 140, respectively.

Moreover, each of the first bumps 150 corresponds to each of the first connection points 130 and all of the first bumps 150 are formed on the outside area 123. Each of the first lead lines 160 is formed on the base film 120 and extended toward each first bump 150 from each first connection point 130, that is, each first lead line 160 is connected between each first connection point 130 and each first bump 150.

On the other hand, each of the second bumps 170 corresponds to each of the second connection points 140 and all of the second bumps 170 are formed on the central region 125. Each of the second lead lines 180 is formed on the base film 120 and is extended toward each second bump 170 from each second connection point 140, that is, each second lead line 180 is connected between each second connection point 140 and each second bump 170.

In the above structure, the first and the second lead lines 160 and 180 have a staggered arrangement from each other and extended in opposite directions.

Practically, the distance or the gap between first lead lines 160 is substantially equal to twice the distance of the above-mentioned conventional techniques. Besides, the first and second lead lines 160 and 180 are wired or formed on the same plane or layer and without any expansion of an area of the layer. In other words, the illustrated TAB film 110 has only one wiring layer.

Consequently, the TAB film 110 of the present invention can also cope with an increase of the number of pads with package size kept unchanged and serves to obtain a low cost package as compared with the above-mentioned conventional techniques. As a result, the package manufactured by using the TAB film 110 is small in size and thin in thickness.

What is claimed is:

1. A tape automated bonding (TAB) film for use in mounting a chip, comprising:

a base film having a chip mounting area for the chip and an outside area for surrounding the chip mounting area, said chip mounting area being divided into a central region, a peripheral region located outside of said central region, and an intermediate region between said central region and said peripheral region;

a plurality of peripheral connection points formed on said peripheral region;

a plurality of inner connection points formed on said intermediate region with said peripheral connection points and said inner connection points alternately arranged on said chip mounting area;

a plurality of first bumps each of which corresponds to each of said peripheral connection points and which are all formed on said outside area;

a plurality of first lead lines which are formed on the base film and each of which is connected between each peripheral connection point and each first bump;

a plurality of second bumps each of which corresponds to each of said inner electrode pads and which are all formed on said central region; and a plurality of second lead lines which are formed on the base film and each of which is connected between each inner electrode pad and each second bump.

2. A tape automated bonding (TAB) film as claimed in claim 1, wherein said plurality of second bumps are arranged in an array fashion.

3. A tape automated bonding (TAB) film for use in mounting a chip, comprising:

a base film having a chip mounting area for the chip and an outside area for surrounding the chip mounting area, said chip mounting area being divided into a central region, and a peripheral region located outside of said central region;

a plurality of first connection points formed on said peripheral region;

a plurality of second connection points which are formed on said peripheral region with said first and second connection points alternately arranged on said peripheral region;

a plurality of first bumps each of which corresponds to each of said first connection points and which is formed on said outside area;

a plurality of first lead lines each of which is formed on the base film and which is connected between each first connection point and each first bump;

a plurality of second bumps each of which corresponds to each of said second connection points and which is formed on said central region; and a plurality of second lead lines each of which is formed on the base film and which is connected between each second connection point and each second bump.

* * * * *